(12) United States Patent
Sneh et al.

(10) Patent No.: US 6,540,838 B2
(45) Date of Patent: Apr. 1, 2003

(54) APPARATUS AND CONCEPT FOR MINIMIZING PARASITIC CHEMICAL VAPOR DEPOSITION DURING ATOMIC LAYER DEPOSITION

(75) Inventors: Ofer Sneh, Mountain View, CA (US); Carl J. Galewski, Aromas, CA (US)

(73) Assignee: Genus, Inc., Sunnyvale, CA (US)

( * ) Notice: Subject to any disclaimer, the term of this patent is extended or adjusted under 35 U.S.C. 154(b) by 0 days.

(21) Appl. No.: 10/186,071

(22) Filed: Jun. 28, 2002

(65) Prior Publication Data

US 2002/0162506 A1 Nov. 7, 2002

Related U.S. Application Data

(63) Continuation of application No. 09/727,978, filed on Nov. 29, 2000, now Pat. No. 6,451,119.

(51) Int. Cl.⁷ ............................................. C23C 16/00
(52) U.S. Cl. ............... 118/715; 118/726; 118/723 MW
(58) Field of Search ................ 438/680, 681; 118/715, 726, 723 MW, 719, 725, 723 R, 723 E, 724

(56) References Cited

U.S. PATENT DOCUMENTS

| | | | |
|---|---|---|---|
| 5,015,503 A | * | 5/1991 | Varrin, Jr. et al. ........ 427/255.2 |
| 5,916,365 A | * | 6/1999 | Sherman ...................... 117/92 |
| 6,086,679 A | * | 7/2000 | Lee et al. ................... 118/724 |
| 6,099,649 A | * | 8/2000 | Schmitt et al. ............. 118/715 |
| 6,200,893 B1 | | 3/2001 | Sneh |
| 6,305,314 B1 | | 10/2001 | Sneh et al. |
| 6,451,119 B2 | | 9/2002 | Sneh et al. |

\* cited by examiner

*Primary Examiner*—Caridad Everhart
(74) *Attorney, Agent, or Firm*—Donald R. Boys; Central Coast Patent Agency, Inc.

(57) ABSTRACT

A new method and apparatus for avoiding contamination of films deposited in layered depositions, such as Atomic Layer Deposition (ALD) and other sequential chemical vapor deposition (CVD) processes, is taught, wherein CVD-deposited contamination of ALD films is prevented by use of a pre-reaction chamber that effectively causes otherwise-contaminating gaseous constituents to deposit on wall elements of gas-delivery apparatus prior to entering the ALD chamber.

10 Claims, 9 Drawing Sheets

APPARATUS AND CONCEPT FOR MINIMIZING PARASITIC CHEMICAL VAPOR DEPOSITION DURING ATOMIC LAYER DEPOSITION

This is a continuation of Ser. No. 09/727,978, filed Nov. 29, 2000, now U.S. Pat. No. 6,451,119.

FIELD OF THE INVENTION

The present invention is in the area of chemical vapor deposition, and pertains more particularly to new methods and apparatus for depositing films by atomic layer deposition. This invention is an extension of these new methods and particularly covers a method for preventing parasitic chemical vapor deposition and the resultant contamination.

BACKGROUND OF THE INVENTION

In the manufacture of integrated circuits, deposition of thin films of many pure and compound materials is necessary, and many techniques have been developed to accomplish such depositions. In recent years the dominant technique for deposition of thin films in the art has been chemical vapor deposition (CVD), which has proven to have superior ability to provide uniform even coatings, and to coat relatively conformally into vias and over other high-aspect and uneven features in wafer topology. As device density has continued to increase and geometry has continued to become more complicated, even the superior conformal coating of CVD techniques has been challenged, and new and better techniques are needed.

The approach of a variant of CVD, Atomic Layer Deposition has been considered for improvement in uniformity and conformality, especially for low temperature deposition. However the practical implementation of this technology requires a solution to higher purity and higher throughput. This patent addresses these requirements.

Atomic Layer Deposition

In the field of CVD a process known as Atomic Layer Deposition (ALD) has emerged as a promising candidate to extend the abilities of CVD techniques, and is under rapid development by semiconductor equipment manufacturers to further improve characteristics of chemical vapor deposition. ALD is a process originally termed Atomic Layer Epitaxy, for which a competent reference is: *Atomic Layer Epitaxy*, edited by T. Suntola and M. Simpson, published by Blackie, Glasgo and London in 1990. This publication is incorporated herein by reference.

Generally ALD is a process wherein conventional CVD processes are divided into single-monolayer deposition steps, wherein each separate deposition step theoretically goes to saturation at a single molecular or atomic monolayer thickness, and self-terminates.

The deposition is the outcome of chemical reactions between reactive molecular precursors and the substrate. In similarity to CVD, elements composing the film are delivered as molecular precursors. The net reaction must deposit the pure desired film and eliminate the "extra" atoms that compose the molecular precursors (ligands). In the case of CVD the molecular precursors are fed simultaneously into the CVD reactor. A substrate is kept at temperature that is optimized to promote chemical reaction between the molecular precursors concurrent with efficient desorption of byproducts. Accordingly, the reaction proceeds to deposit the desired pure film.

For ALD applications, the molecular precursors are introduced into the ALD reactor separately. This is practically done by flowing one precursor at a time, i.e. a metal precursor —$ML_x$ (M=Al, W, Ta, Si etc.) that contains a metal element —M which is bonded to atomic or molecular ligands —L to make a volatile molecule. The metal precursor reaction is typically followed by inert gas purging to eliminate this precursor from the chamber prior to the separate introduction of the other precursor.

This purge step (or sometimes a pump-down step) is key for ALD films without the undesired CVD component. During the purge (evacuation) step the last used chemical is removed from the chamber and gas introduction lines, enabling introduction of a different chemical.

An ALD reaction will take place only if the surface is prepared to react directly with the molecular precursor. Accordingly the surface is typically prepared to include hydrogen-containing ligands —AH that are reactive with the metal precursor. Surface-molecule reactions can proceed to react with all the ligands on the surface and deposit a monolayer of the metal with its passivating ligand: substrate —$AH+ML_x$→substrate —$AML_y$+HL, where HL is the exchange reaction by-product. During the reaction the initial surface ligands —AH are consumed and the surface becomes covered with L ligands, that cannot further react with the metal precursor —$ML_x$. Therefore, the reaction self-saturates when all the initial ligands are replaced with —$ML_y$ species.

After completing the metal precursor reaction all of the metal precursor is typically removed from the reactor prior to the introduction of another precursor. The second type of precursor is used to restore the surface reactivity towards the metal precursor, i.e. eliminating the L ligands and redepositing AH ligands.

Most ALD processes have been applied to deposit compound films. In this case the second precursor is composed of a desired (usually nonmetallic) element —A (i.e. O, N, S), and hydrogen using, for example $H_2O$, $NH_3$, or $H_2S$. The reaction: —$ML+AH_z$→—M—AH+HL (for the sake of simplicity the chemical reactions are not balanced) converts the surface back to be AH-covered. The desired additional element —A is deposited and the ligands L are eliminated as volatile by-product. Again, the reaction consumes the reactive sites (this time the L terminated sites) and self-saturates when the reactive sites are entirely depleted.

The sequence of surface reactions that restores the surface to the initial point is called the ALD deposition cycle. Restoration to the initial surface is the keystone of ALD. It implies that films can be layered down in equal metered sequences that are all identical in chemical kinetics, deposition per cycle, composition and thickness. Self-saturating surface reactions make ALD insensitive to transport non-uniformity either from flow engineering or surface topography (i.e. deposition into high aspect ratio structures). Non uniform flux can only result in different completion time at different areas. However, if each of the reactions is allowed to complete on the entire area, the different completion kinetics bear no penalty.

As is often the case with process development, the initial promised advantages of a new technique do not, in the end, attain their full initial promise. Unfortunately, ALD has a serious fundamental problem. Unlike CVD reactions that are of a continuous steady state nature, ALD reactions follow kinetics of molecular-surface interaction. Kinetics of molecular-surface reactions depends on the individual reaction rate between a molecular precursor and a surface reactive site and the number of available reactive sites. As the reaction proceeds to completion, the surface is converted from being reactive to non-reactive. As a result the reaction rate is slowing down during the deposition. In the simplest case the rate, dN/dt is proportional to the number of reactive sites, dN/dt=−kN, where N is the number of reactive sites and k is the (single site) reaction rate. Eliminating reactive sites (or growing of the already-reacted sites) follows an exponential time dependence $kN(t)=kN_0\exp(-kt)$. This fundamental property of molecule-surface kinetics was named after the great scientist Langmuir, and is quite well-known in the art.

The interpretation of Langmuirian kinetics limitations illustrates a serious drawback of ALD and a severe deviation from the ideal picture. Accordingly, the self-terminating reactions never really self-terminate (they would require an infinite time because the rate is exponentially decreasing). It means that under practical conditions the surface is never entirely reacted to completion after a deposition cycle. If the surface is not completely reacted there are leftover undesired elements in the film. For example, if the $ML_x$ reaction cannot totally consume the surface —AH sites, the film will have H incorporation. Likewise, if the $AH_y$ reaction is not carried to completion, undesired L incorporation is inevitable. Clearly, the quality of the film depends on the impurity levels. The throughput-quality tradeoff is of particular concern because it carries an exponential throughput penalty to attain a reduction of impurity levels.

In conventional atomic layer deposition one must accept low throughput to attain high-purity film, or accept lower-purity films for higher throughput. What is clearly needed is an apparatus and methods which not only overcome the Langmuirian limitations but simultaneously provide higher-purity films than have been available in the prior art methods. Such apparatus and methods are provided in embodiments of the present invention, taught in enabling detail below.

In addition to the above ideal situation, ALD chemicals, such as the $ML_x$ and $AH_z$ in the above example are typically extremely reactive, and will lead to extensive undesired CVD side reactions if they coexist in the chamber even at trace levels. Since CVD is a very undesirable companion, fast and efficient purge has been the most difficult and challenging aspect of engineering high throughput ALD apparatuses.

Chemical delivery lines must be short and free of trapped volume to facilitate efficient purging of chemicals. However, some limitation on efficient purge come from line surface outgassing that is difficult to avoid. Accordingly, some trace of chemical mixing is impossible to suppress with throughput limited short purge times. What is needed is a rapid method of removing trace quantities of the previously used chemical precursor prior to introduction of the desired new chemical precursor.

Our invention, which provides the clear and present need, provides an ALD Pre-Reactor as an apparatus and process that eliminates trace amounts of chemical mixing without CVD contribution to the ALD film on the substrates.

SUMMARY OF THE INVENTION

In a preferred embodiment of the present invention a method for minimizing parasitic chemical vapor deposition during an atomic layer deposition process is provided, comprising steps of (a) imposing a pre-reaction chamber between gas sources and a substrate to be coated; and (b) heating a surface in the pre-reaction chamber to a temperature sufficient to cause contaminant elements to deposit by CVD reaction on the heated surface.

In an alternative embodiment a pre-reaction chamber for an atomic layer deposition system is provided, comprising a passage for delivery of gases in alternating, incremental fashion from a gas source to a gas distribution apparatus; and a heated surface within the pre-reaction chamber for causing contaminant elements to deposit prior to the gases entering the gas distribution apparatus.

In the embodiments of the invention taught in enabling detail below, for the first time a method and apparatus is provided that effectively removes contaminant gases in atomic layer deposition processes, and allows cycle times to be significantly increased as a result.

DESCRIPTION OF THE PREFERRED EMBODIMENTS

The inventor has developed an enhanced variation of ALD which alters the conventional surface preparation steps of ALD and overcomes the problems of conventional ALD, producing high throughput without compromising quality. The inventor terms the new and unique process Radical-Assisted Sequential CVD (RAS-CVD).

Figure 1:
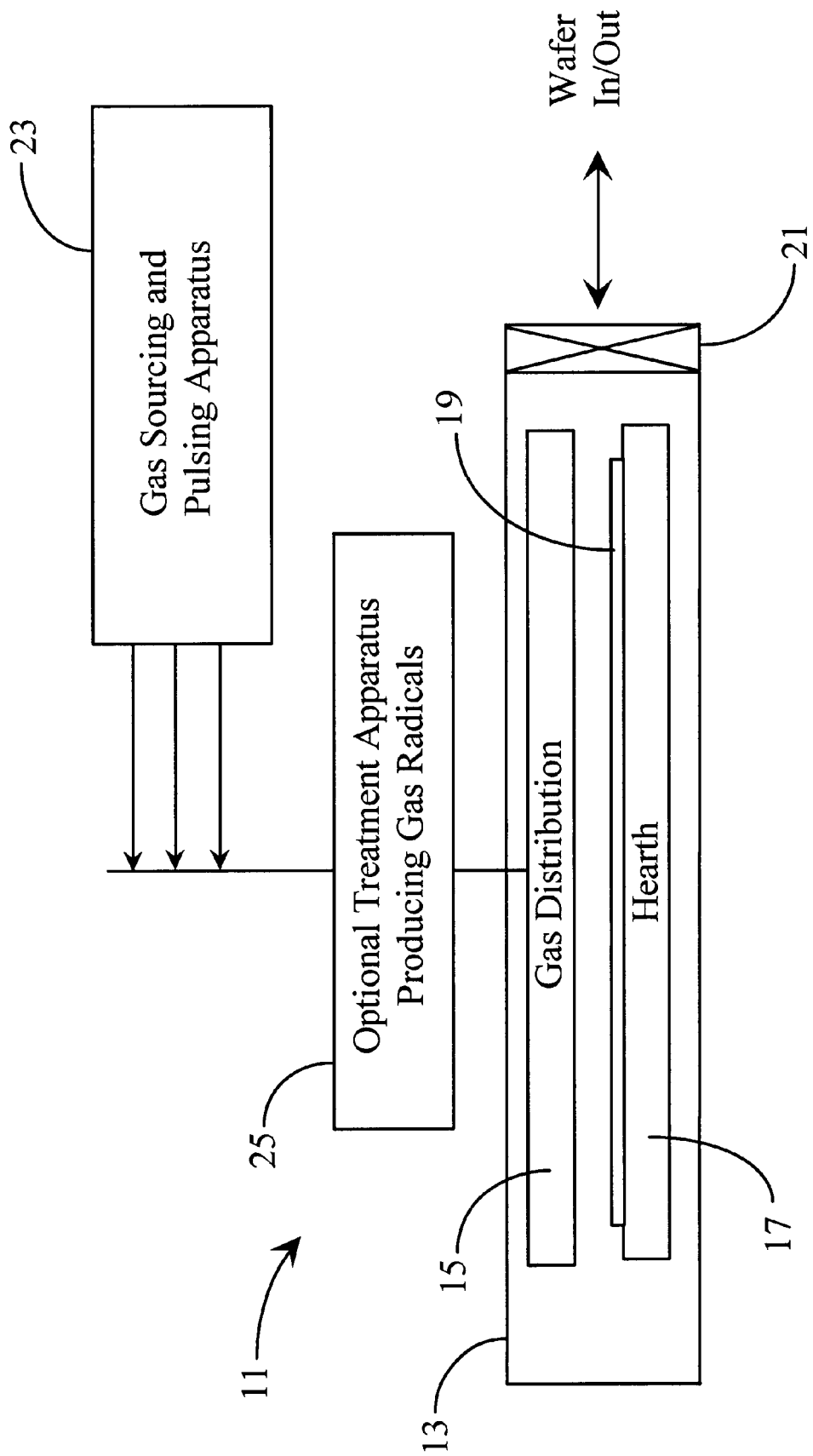
FIG. 1 is a generalized diagram of a reactor and associated apparatus for practicing a radical-assisted sequential CVD process according to an embodiment of the present invention.

FIG. 1 is a generalized diagram of a system 11 for practicing RAS-CVD according to an embodiment of the present invention. In this exemplary system a deposition chamber 13 has a heatable hearth for supporting and heating a substrate 19 to be coated, and a gas distribution apparatus, such as a showerhead 15, for delivering gaseous species to the substrate surface to be coated. Substrates are introduced and removed from chamber 13 via a valve 21 and substrate-handling apparatus not shown. Gases are supplied from a gas sourcing and pulsing apparatus 23, which includes metering and valving apparatus for sequentially providing gaseous materials. An optional treatment apparatus 25 is provided for producing gas radicals from gases supplied from apparatus 23.

The term radicals is well-known and understood in the art, but will be qualified again here to avoid confusion. By a radical is meant an unstable species. For example, oxygen is stable in diatomic form, and exists principally in nature in this form. Diatomic oxygen may, however, be caused to split to monatomic form, or to combine with another atom to produce ozone, a molecule with three atoms. Both monatomic oxygen and ozone are radical forms of oxygen, and are more reactive than diatomic oxygen. In many cases in embodiments of the present invention the radicals produced and used are single atom forms of various gases, such as oxygen, hydrogen, and nitrogen, although the invention is not strictly limited to monatomic gases.

Figure 2:
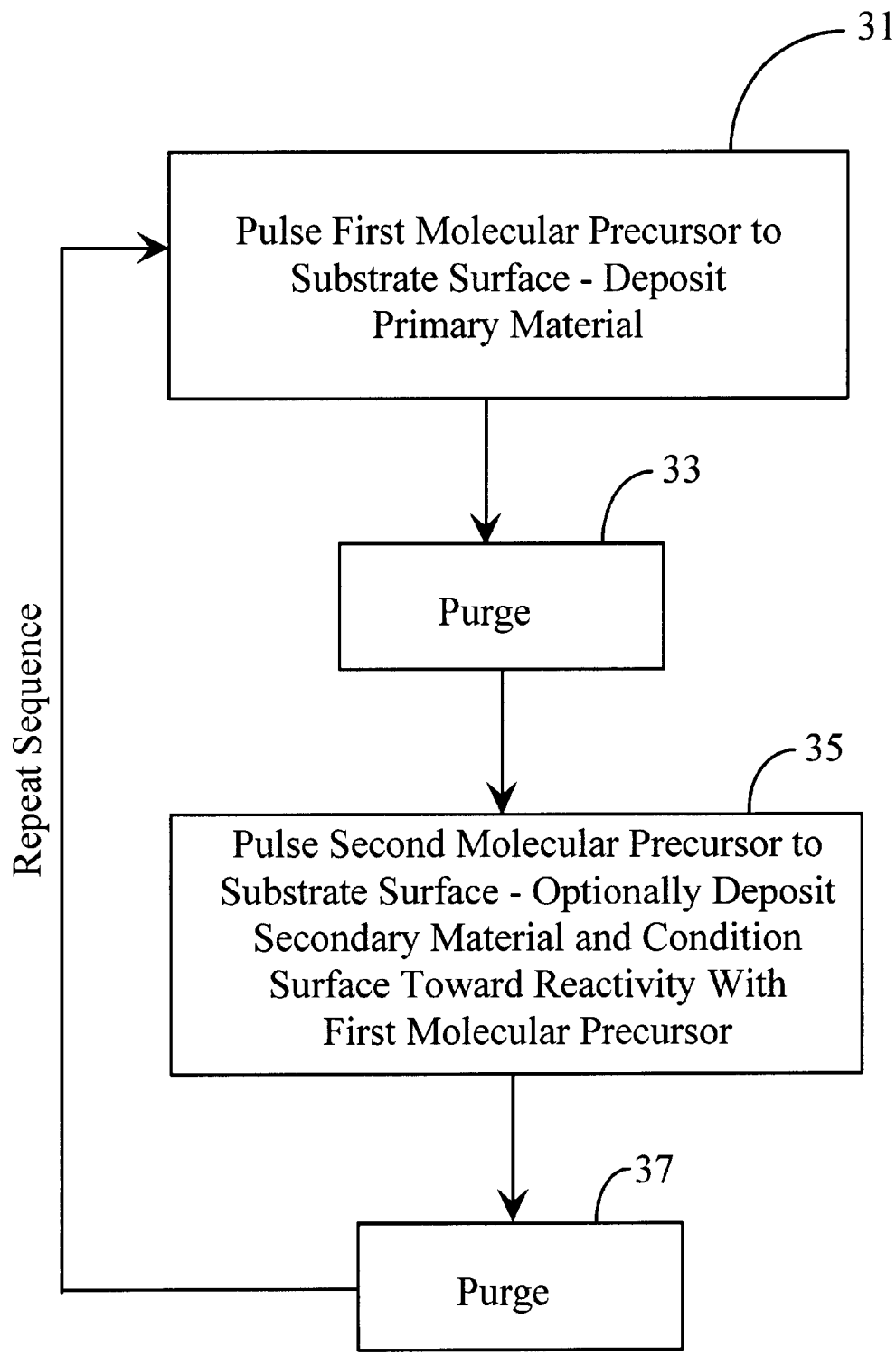
FIG. 2 is a step diagram illustrating the essential steps of an atomic layer deposition process.

FIG. 2 is a step diagram of a conventional Atomic Layer Deposition process, and is presented here as contrast and context for the present invention. In conventional ALD, as shown in FIG. 2, in step 31 a first molecular precursor is pulsed in to a reactor chamber, and reacts with the surface to produce (theoretically) a monolayer of a desired material. Often in these processes the precursor is a metal-bearing gas, and the material deposited is the metal; Tantalum from $TaCl_5$, for example.

In step 33 in the conventional process an inert gas is pulsed into the reactor chamber to sweep excess first precursor from the chamber.

In step 35 in the conventional system a second precursor, typically non-metallic, is pulsed into the reactor. The primary purpose of this second precursor is to condition the substrate surface back toward reactivity with the first precursor. In many cases the second precursor also provides material from the molecular gas to combine with metal at the surface, forming compounds such as an oxide or a nitride with the freshly-deposited metal.

At step 37 the reactor chamber is purged again to remove excess of the second precursor, and then step 31 is repeated. The cycle is repeated as many times as is necessary to establish a desired film.

Figure 3:
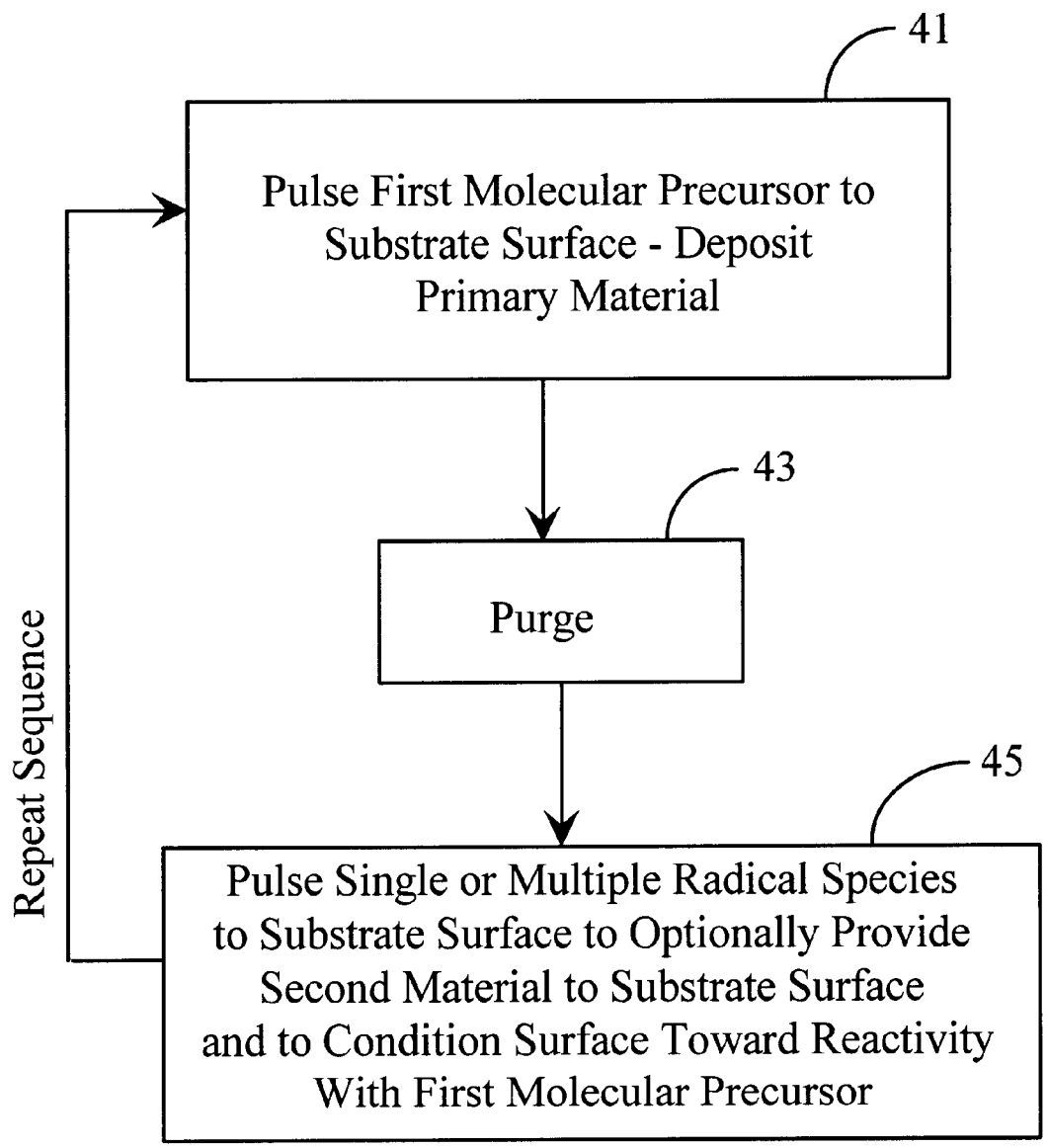
FIG. 3 is a step diagram illustrating steps in a radical-assisted CVD process according to an embodiment of the present invention.

FIG. 3 is a step diagram illustrating steps in a radical-assisted CVD process according to an embodiment of the present invention. In the unique process illustrated by FIG. 3 the first steps, steps 41 and 43, are the same as in the conventional process. A first precursor is pulsed in step 41 to react with the substrate surface forming a monolayer of deposit, and the chamber is purges in step 43. The next step is unique. In step 45 single or multiple radical species are pulsed to the substrate surface to optionally provide second material to the surface and to condition the surface toward reactivity with the first molecular precursor in a subsequent step. Then step 41 is repeated. There is no need for a second purge, and the cycle is repeated as often as necessary to accomplish the desired film.

Step 45 may be a single step involving a single radical species. For example, the first precursor may deposit a metal, such as in W from $WF_6$, and the radical species in step 45 may be atomic hydrogen. The atomic hydrogen very quickly and effectively neutralizes any remaining F to HF, and terminates the surface with atomic hydrogen, providing reactive surface for the next pulse of $WF_6$.

In many cases step 45 will be a compound step comprising substeps involving different radical species. A good example is a sequence of atomic hydrogen followed by atomic oxygen, followed by atomic hydrogen again. The first hydrogen step neutralizes Cl or other remaining ligand, the atomic oxygen provides an oxide of the freshly-deposited metal, and the second atomic hydrogen terminated the surface with (OH) in preparation for the next metal precursor step.

There are a broad variety of materials and combinations in step 45, and many are disclosed in more detail below, along with a more complete explanation of process chemistry.

In RAS-CVD, following the metal precursor reaction, highly reactive radical species are introduced to quickly react with products of the metal precursor reaction and to prepare the surface for the next metal precursor reaction. Radical species, as introduced above, are reactive atoms or molecular fragments that are chemically unstable and therefore are extremely reactive. In addition, radicals chemisorb to surfaces with virtually 100% efficiency. Radicals may be created in a number of ways, and plasma generation has been found to be an efficient and compatible means of preparation.

RAS-CVD processes use only a single molecular precursor, in many cases a metal precursor. Surface preparation as well as the deposition of nonmetallic elements are accomplished by atom-surface reactions. Following the metal precursor reaction, The —ML terminated surface is reacted with hydrogen atoms to convert the surface into —MH and eliminate HL by-product. Unlike molecule-surface reactions, atom-surface reactions do not depend on the number density of reactive sites. Most atoms (except for noble gases) stick very efficiently to surfaces in an irreversible process because atomic desorption is usually unfavorable. The atoms are highly mobile on non-reactive sites and very reactive at reactive sites. Consequently, atom-surface reactions have linear exposure dependence, as well as high rates.

The —MH surface can be reacted with A atoms to yield a —M—A— surface. In this case some of the H ligands can be eliminated as $AH_y$. For example the —MH surface can be reacted with oxygen atoms to deposit oxide compound. Alternatively, —MH surface can be reacted again with $ML_x$ for atomic layer controlled deposition of M metal films. For the deposition of nitride compound films, A is atomic nitrogen. The surface after the A atomic reaction is terminated with A— and AH. At this point an additional atomic reaction with hydrogen converts the surface to the desired AH ligands that are reactive towards the metal precursor. Alternatively, the MH surface can be reacted with a mixture of A and H atoms to convert the surface into —AH terminated surface with one less step. All the above described reactions are radical-surface reactions that are fast and efficient and depend linearly on exposure. In addition, the final hydrogen reaction results in a complete restoration to the initial surface without any incorporation of impurities.

Another throughput benefit of RAS-CVD is that a single purge step after the metal precursor step is needed, rather than the two purge steps needed in the conventional process. Purge steps are expected by most researchers to be the most significant throughput-limiting step in ALD processes. Another advantage is that RAS-CVD promises longer system uptime and reduced maintenance. This is because atomic species can be efficiently quenched on aluminum walls of the deposition module. Downstream deposition on the chamber and pumping lines is therefore virtually eliminated. RAS-CVD eliminates the use of $H_2O$ and $NH_3$ that are commonly applied for oxides and nitrides deposition (respectively) in the prior art. These precursors are notorious to increase maintenance and downtime of vacuum systems.

According to the above a typical RAS-CVD cycle for a metal oxide film will comprise steps as follows:
1. Metal precursor reaction with —OH (hydroxyl) terminated surface to attach —O—$ML_y$ and eliminate the hydrogen by HL desorption. The surface becomes covered with L ligands, i.e. in the case of $TaCl_5$ the surface becomes covered with Cl atoms.
2. Purge with inert gas to sweep away excess metal precursor.

3. Atomic hydrogen step—eliminates the ligands L by HL desorption and terminates the surface with hydrogen.
4. Atomic oxygen step—reacts with monolayer of metal to form oxide. Atomic hydrogen again to leave hydroxyl saturated surface for next metal precursor step.

At this point the quality of oxide films (i.e. insulation properties, dielectric strength, charge trapping) can be improved by running steps 4+5 for multiple times. For example: $Al_2O_3$ RAS-CVD can be realized from trimethylaluminum $Al(CH_3)_3$, hydrogen and oxygen exposures. $Al(CH_3)_3$ reacting with —OH terminated surface will deposit —OAl(CH$_3$)$_x$ concurrent with the desorption of methane ($CH_4$). The —OAl(CH$_3$)$_x$(x=1,2) surface will be treated with H atoms to eliminate x number of methane molecules and terminate the surface with —OAlH. This surface after consecutive (or concurrent) reaction with O atoms and H atoms will be terminated —OAl—OH which is the restoration state. At this point, the RAS-CVD process can proceed by applying another $Al(CH_3)_3$ reaction. Alternatively, the —OAl—OH surface can be exposed to another cycles of O and H atoms. At temperature above 100° C. this process will exchange OH groups and Al—O—Al bridge sites and the resulted —OAl—OH surface will be more thermodynamically favorable than the beginning surface, because the process eliminates the more strained (Al—O—)$_n$ ring structures as well as titrating away defects and broken bonds). Since the atomic reactions are rather fast, these quality improvements are not expected to be a major throughput concern. In fact, ultimate quality may be achieved by applying the O, H cycles for several times. Following, a given number of O, H atomic reactions the sequence will continue with the next $Al(CH_3)_3$ reaction.
6. Repeat steps from 1.

For metal nitrides atomic nitrogen is substituted for oxygen. For pure metal depositions the oxygen/nitrogen step may be eliminated in favor of a single atomic hydrogen step, such as for tungsten films. The hydrogen saturated surface after the first atomic hydrogen step is reactive with $WF_6$ to produce the pure metal.

The generic nature of RAS-CVD is advantageous for multiple layer combination films of different oxides, different nitrides, oxides with nitrides, different metals and metals with compound films.

In another unique process, useful for barrier layers, the WN process may be combined with the pure W process to produce alternating W and WN layers in a variety of schemes to suppress polycrystallization and to reduce the resistivity of the barrier layer. Other properties, such as electromigration may be controlled by an ability to provide a graded layer of WN with reduced nitrogen content at the copper interface for such applications.

In embodiments of the invention a broad variety of process chemistries may be practiced, providing a broad variety of final films. In the area of pure metals, for example, the following provides a partial, but not limiting list:
1. Tungsten from tungsten hexafluoride.
2. Tantalum from tantalum pentachloride.
3. Aluminum from either aluminum trichloride or trimethylaluminum.
4. Titanium from titanium tetrachloride or titanium tetraiodide.
5. Molybdenum from molybdenum hexafluoride.
6. Zinc from zinc dichloride.
7. Hafnium from hafnium tetrachloride.
8. Niobium from niobium pentachloride.
9. Copper from $Cu_3Cl_3$.

In the area of oxides the following is a partial but not limiting list:
1. Tantalum pentoxide from tantalum pentachloride.
2. Aluminum oxide from trimethylaluminum or aluminum trichloride.
3. Titanium oxide from titanium tetrachloride or titanium tetraiodide.
4. Niobium pentoxide from niobium pentachloride.
5. Zirconium oxide from zirconium tetrachloride.
6. Hafnium oxide from hafnium tetrachloride.
7. Zinc oxide from zinc dichloride.
8. Molybdenum oxide from molybdenum hexafluoride or molybdenum pentachloride.
9. Manganese oxide from manganese dichloride.
10. Tin oxide from tin tetrachloride.
11. Indium oxide from indium trichloride or trimethylindium.
12. Tungsten oxide from tungsten hexafluoride.
13. Silicon dioxide from silicon tetrachloride.

In the area of nitrides, the following is a partial but not limiting list:
1. Tungsten nitride from tungsten hexafluoride.
2. Tantalum nitride from tantalum pentachloride.
3. Aluminum nitride from aluminum trichloride or trimethylaluminum.
4. Titanium nitride from titanium tetrachloride.
5. Silicon nitride from silicon tetrachloride or dichlorosilane.
6. Gallium nitride from trimethylgallium.

Hardware Requirements

Another advantage of RAS-CVD is that it is compatible in most cases with ALD process hardware. The significant difference is in production of atomic species and/or other radicals, and in the timing and sequence of gases to the process chamber. Production of the atomic species can be done in several ways, such as (1) in-situ plasma generation, (2) intra-showerhead plasma generation, and (3) external generation by a high-density remote plasma source or by other means such as UV dissociation or dissociation of metastable molecules. Referring again to FIG. 1, these methods and apparatus are collectively represented by apparatus 25.

Of the options, in-situ generation is the simplest design, but poses several problems, such as turn on-turn off times that could be a throughput limitation. Intra-showerhead generation has been shown to have an advantage of separating the atomic specie generation from the ALD space. The preferable method at the time of this specification is remote generation by a high-density source, as this is the most versatile method. The radicals are generated in a remote source and delivered to the ALD volume, distributed by a showerhead over the wafer in process.

It will be apparent to the skilled artisan that there are a variety of options that may be exercised within the scope of this invention as variations of the embodiments described above . . . some have already been described. For example, radicals of the needed species, such as hydrogen, oxygen, nitrogen, may be generated in several ways and delivered in the process steps. Further, ALD chambers, gas distribution, valving, timing and the like may vary in many particulars. Still further, many metals, oxides nitrides and the like may be produced, and process steps may be altered and interleaved to create graded and alternating films.

Figure 4:
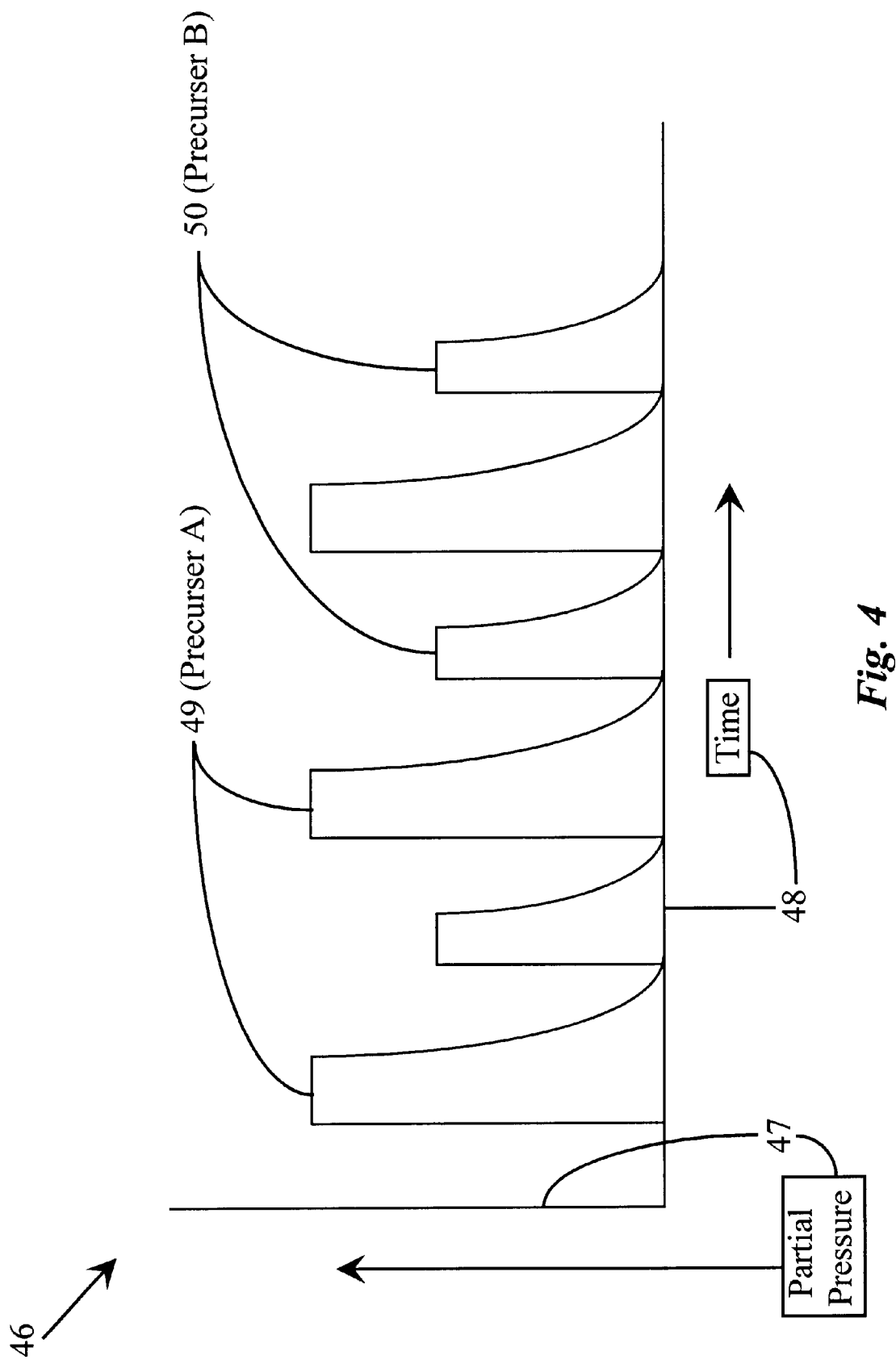
FIG. 4 illustrates a typical time dependent chemical precursor partial pressure curve for systems with well designed gas flow source and pulsing subsystems.

Apparatus and Concept for Minimizing Parasitic Chemical Vapor Deposition During Atomic Layer Deposition In a further embodiment of the present invention an apparatus and method is provided for preventing contamination by CVD deposition during ALD processes. FIG. 4 is a generalized chemical precursor partial pressure vs. time curve 46 for a well behaved system using rapid pulsing of the chemical precursor species and purge steps. The partial pressure 47 of each active chemical precursor is qualitatively shown on the Y axis of the diagram against time on the X axis. The partial pressure of precursor "A" 49 and precursor "B" 50 are shown for convenience. Systems with more than two precursors would behave similarly with distinct partial pressure peaks for each chemical precursor.

Of particular note in FIG. 4 is that while the partial pressure of each precursor rises rapidly at the start of each pulse, there is a distinct "tail" at the end of each pulse. This "tail" represents an undesired condition where the precursor is not fully removed from the deposition system. This tail is a result of various real phenomena, such as, for example, the fact that gases molecules have a certain affinity for surfaces in conduits and chambers, and such surface-restrained molecules continue to evolve in a system after gas flow is shut off, a phenomenon known in the vacuum arts as outgasing. If the next precursor is introduced into the deposition chamber 59, FIG. 6 while the prior precursor is still present, an undesired CVD side reaction occurs and contaminates the desired film on the substrate 61 on FIG. 6. In addition to the contamination of the film, the undesired CVD reaction could nucleate in the gas phase leading to undesirable particle accumulation on the substrate 61 or in the deposition chamber 59.

Figure 5:
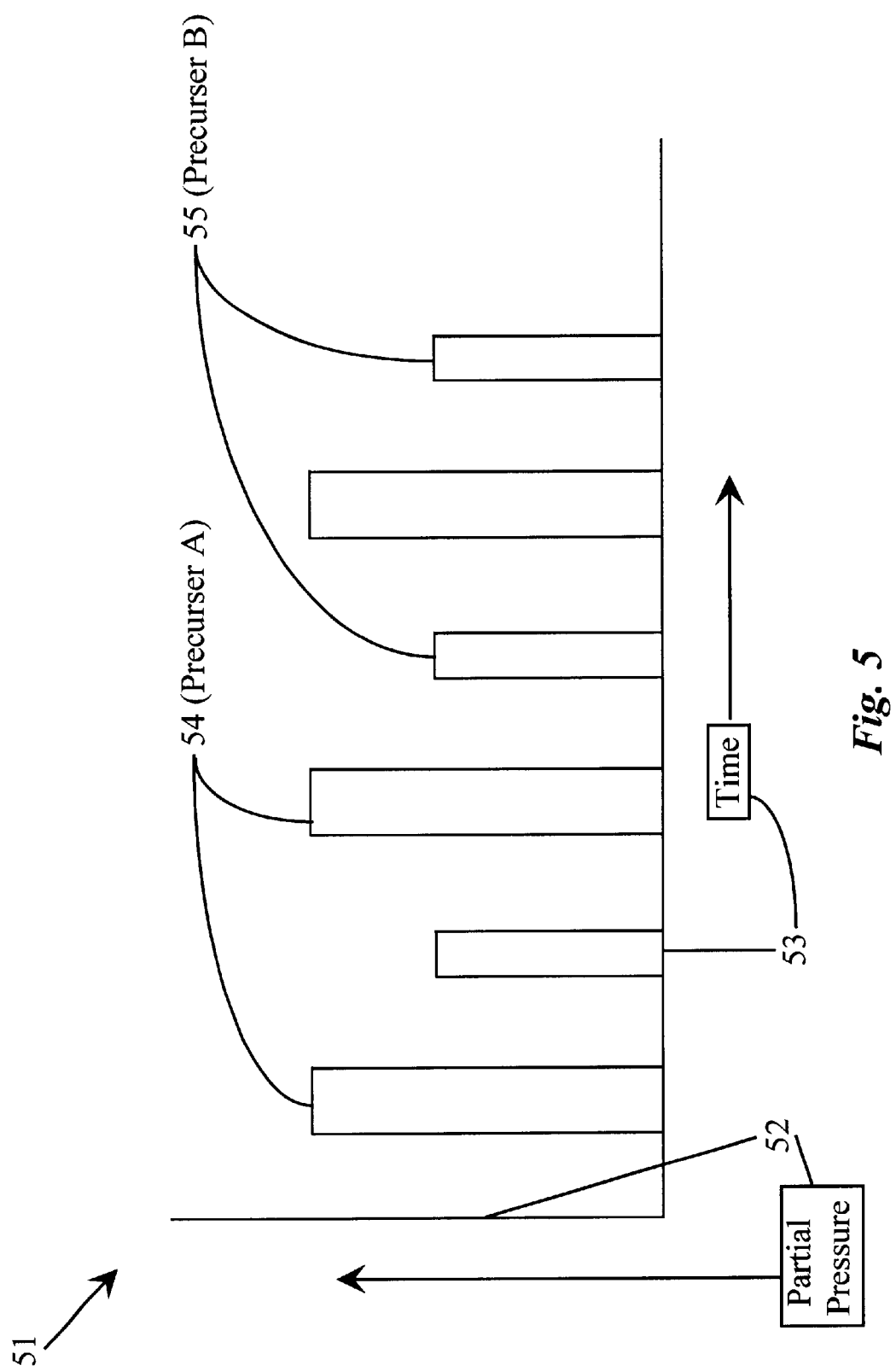
FIG. 5 represents a time dependent chemical precursor partial pressure curve where sharply defined "flow off" conditions are achieved as a result of practicing an embodiment of the present invention.

FIG. 5 is an idealized chemical precursor partial pressure vs. time curve 51 for a well behaved system using rapid pulsing of the chemical precursor species, purge steps, and the innovative Pre-Reactor invention embodied in this patent application. The partial pressure 52 of each active chemical precursor is qualitatively shown on the Y axis of the diagram against time on the X axis. The partial pressure of precursor "A" 54 and precursor "B" 55 are shown for convenience. Systems with more than two precursors would behave similarly with distinct partial pressure peaks for each chemical precursor.

Of particular note in FIG. 5 is that the partial pressure of each precursor rises rapidly at the start of each pulse and falls rapidly at the end of each programmed flow pulse. The distinct chemical "tail" present in FIG. 4 is eliminated primarily as a result of an innovative Pre-Reactor described in this invention. The methods and apparatus used to remove the trace chemical precursor that causes this "tail" effect are described in enabling detail below.

Figure 6:
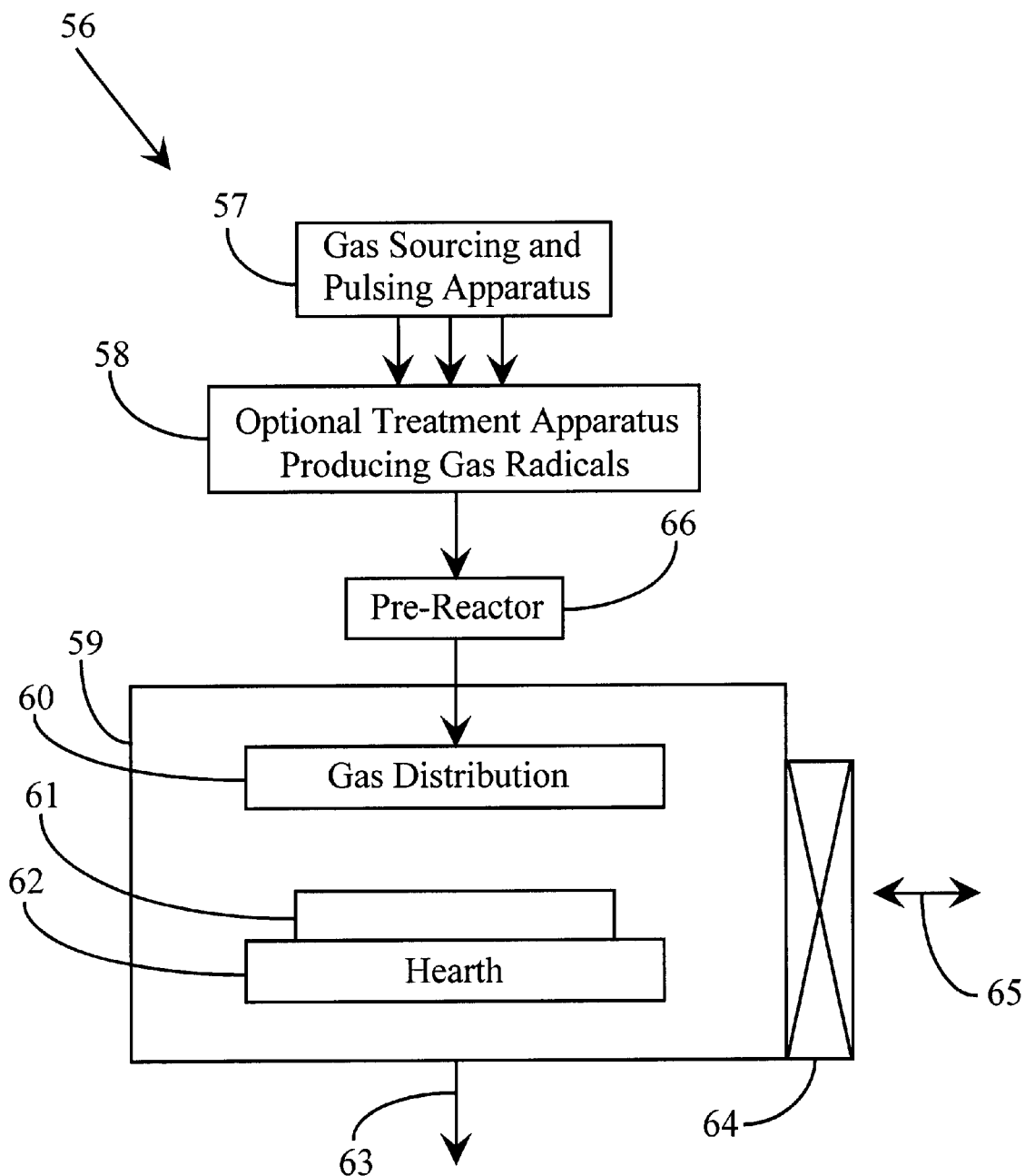
FIG. 6 is a generalized diagram of a reactor and associated apparatus for achieving radical assisted sequential CVD according to an improved embodiment of the present invention which eliminates undesired CVD side reactions.

FIG. 6 is a generalized diagram of a system 56 for practicing RAS-CVD according to an additional embodiment of the present invention. Although RAS-CVD is used as an example, the inventor intends it to be clear that the apparatus and methods of the present invention are not limited to RAS-CVD, but applicable in general to all sorts of ALD and many other sequential CVD processes.

In this exemplary system a deposition chamber 59 has a heatable hearth for supporting and heating a substrate 61 to be coated, and a gas distribution apparatus, such as a showerhead 60, for delivering gaseous species to the substrate surface to be coated. Substrates are introduced and removed (item 65) from chamber 59 via a valve 64 and substrate-handling apparatus not shown. Gases are supplied from a gas sourcing and pulsing apparatus 57, which includes metering and valving apparatus for sequentially providing gaseous materials. An optional treatment apparatus 58 is provided for producing gas radicals from gases supplied from apparatus 57. A Pre-Reactor 66 has been added to this system to provide improved control of unwanted CVD side reactions.

The pre-reactor may take various forms, and some of the possible variations are shown in FIGS. 6, 7, 8 and 9, described in more detail below. All of the figures commonly utilize the gas sourcing and pulsing apparatus 57, the optional treatment apparatus for creating radicals 58, the gas distribution apparatus 60, the deposition chamber 59, a heating hearth 62 for heating substrate 61, a spent chemical effluent system 63, a substrate entry and removal 65 valve 64. These items are common in this exemplary system. In addition, some but not all implementations of the Pre-Reactor are shown. For example, in one embodiment, the gas distribution apparatus, such as a showerhead, may serve double duty, and be the pre-reactor chamber as well.

In FIG. 6, the Pre-Reactor 66 is shown as a physically separate chamber which is placed in the process gas pathway between the Optional Treatment Apparatus Producing Gas Radicals and the Gas Distribution Showerhead. The Pre-Reaction process may take place on any surface with sufficient activation energy supplied either by thermal heating, RF plasma, UV or by other means.

Figure 7:
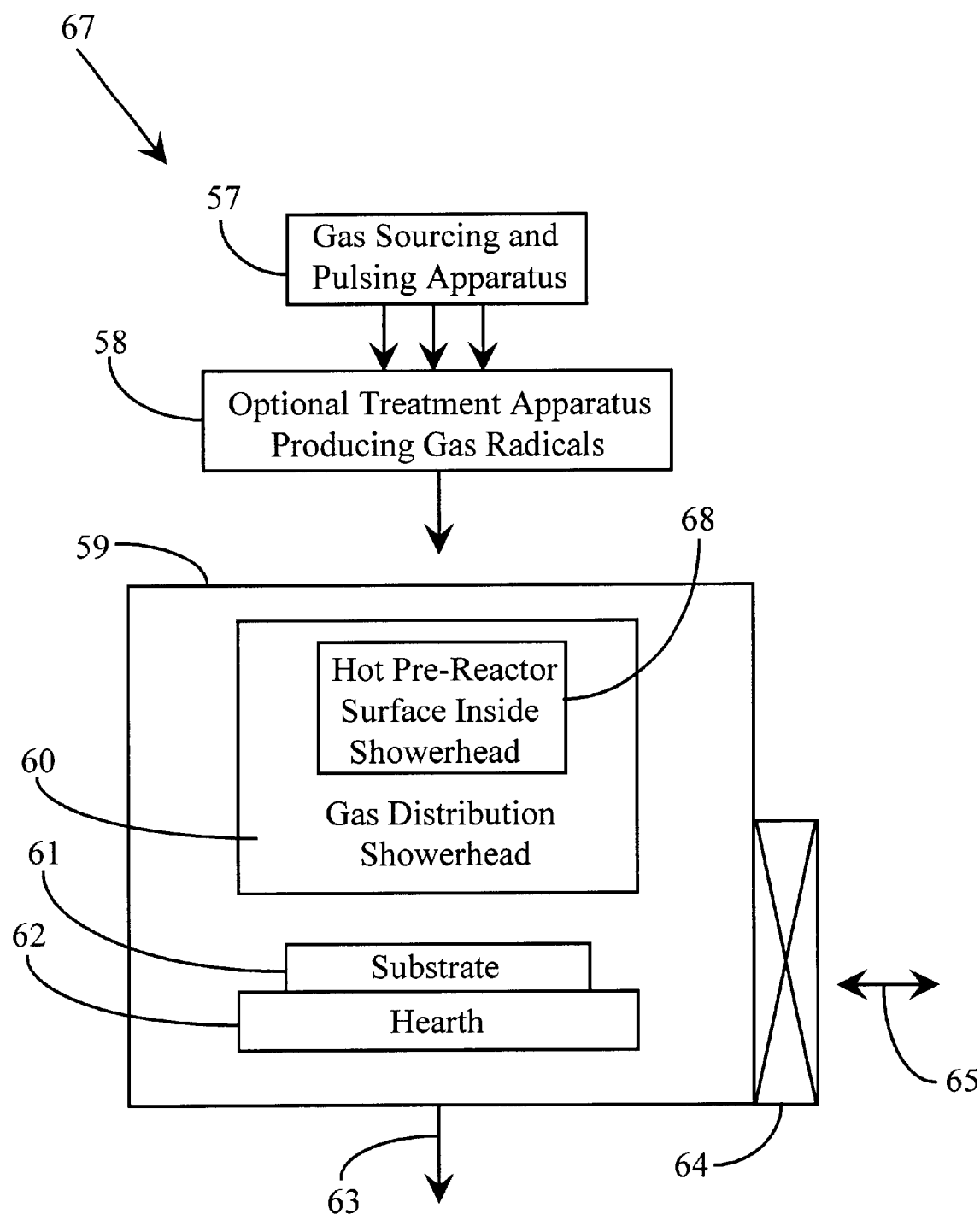
FIG. 7 illustrates a second implementation of the reactor in FIG. 6.

FIG. 7 is a generalized diagram of a system 67 for practicing RAS-CVD in a further embodiment of the present invention. In FIG. 7, two embodiments of the Pre-Reactor 68 are shown. The first is the incorporation of the Pre-Reactor 68 into the Gas Distribution Showerhead 60. In this case, the undesired CVD side reactions are caused to occur on a free-standing, thermally heated surface inside the Gas Distribution Showerhead 68. Such a thermally-heated surface may be provided in a wide variety of ways, and the form of the pre-reactor chamber can take a wide variety of forms as well, such as, for example, a long, coiled, heated conduit. The rapid depletion of the undesired chemical "tail" eliminates the possibility that the side reaction will occur on the substrate allowing a decrease in the time between each chemical reactant entering the system. In one preferred embodiment the necessary thermal input for the pre-reaction is provided by proximity of the showerhead apparatus to substrate 61, with heat transfer from the hearth and the substrate.

Figure 8:
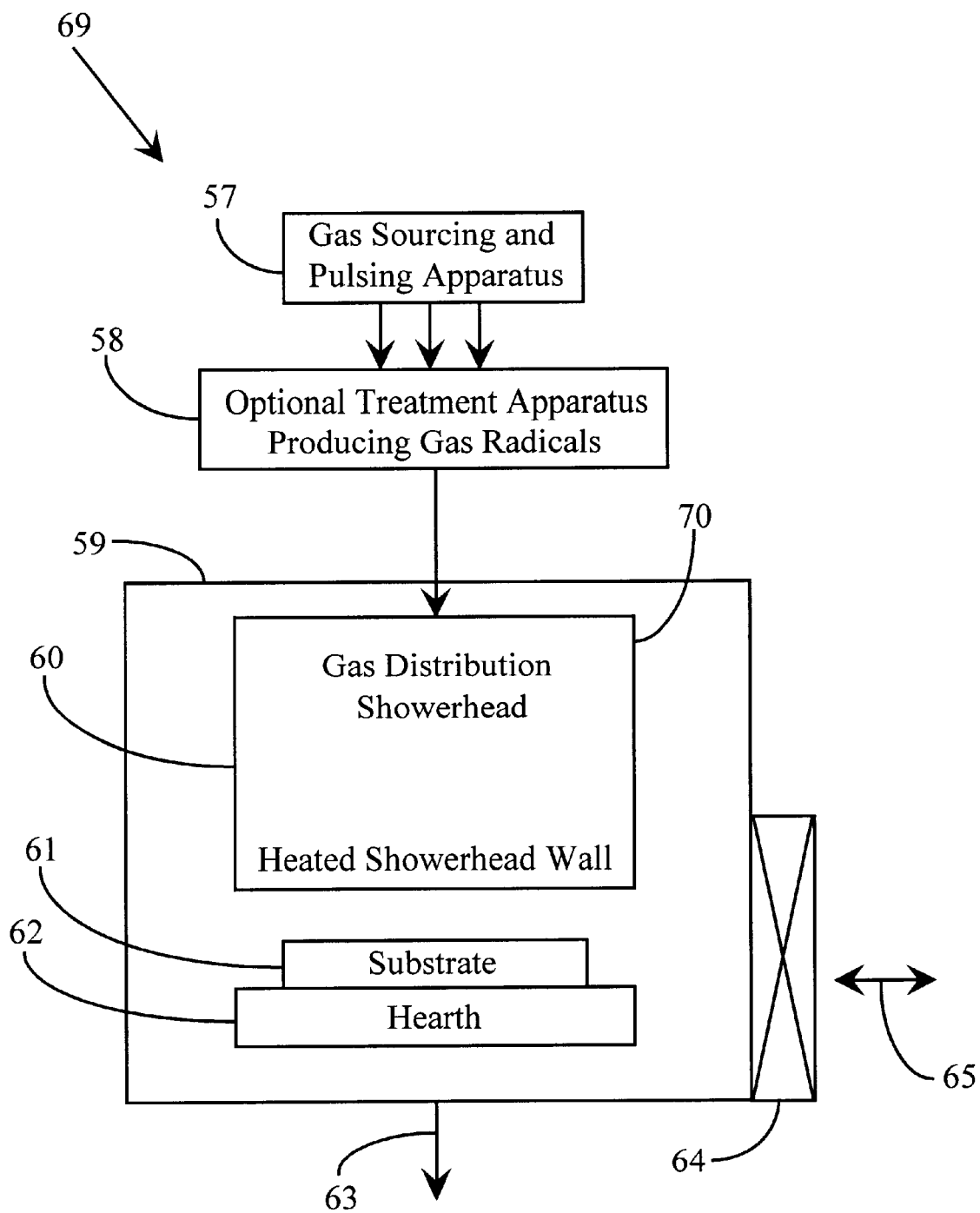
FIG. 8 illustrates a third implementation of the reactor in FIG. 6

FIG. 8 is a generalized diagram of a further embodiment of the present invention providing system 69 for practicing RAS-CVD. In FIG. 8, two embodiments of the Pre-Reactor 70 are shown. The first is the incorporation of the Pre-Reactor 70 into the Gas Distribution Showerhead 60 which is conceptually similar to FIG. 7. In this case, the undesired CVD side reactions are caused to occur on the heated surface of the Gas Distribution Showerhead 68 itself, which is heated in this embodiment by hearth 62 and substrate 61 by virtue of near proximity of these elements to showerhead 60. Again, the rapid depletion of the undesired chemical "tail" eliminates the possibility that the side reaction will occur on the substrate allowing a decrease in the time between each chemical reactant entering the system.

Figure 9:
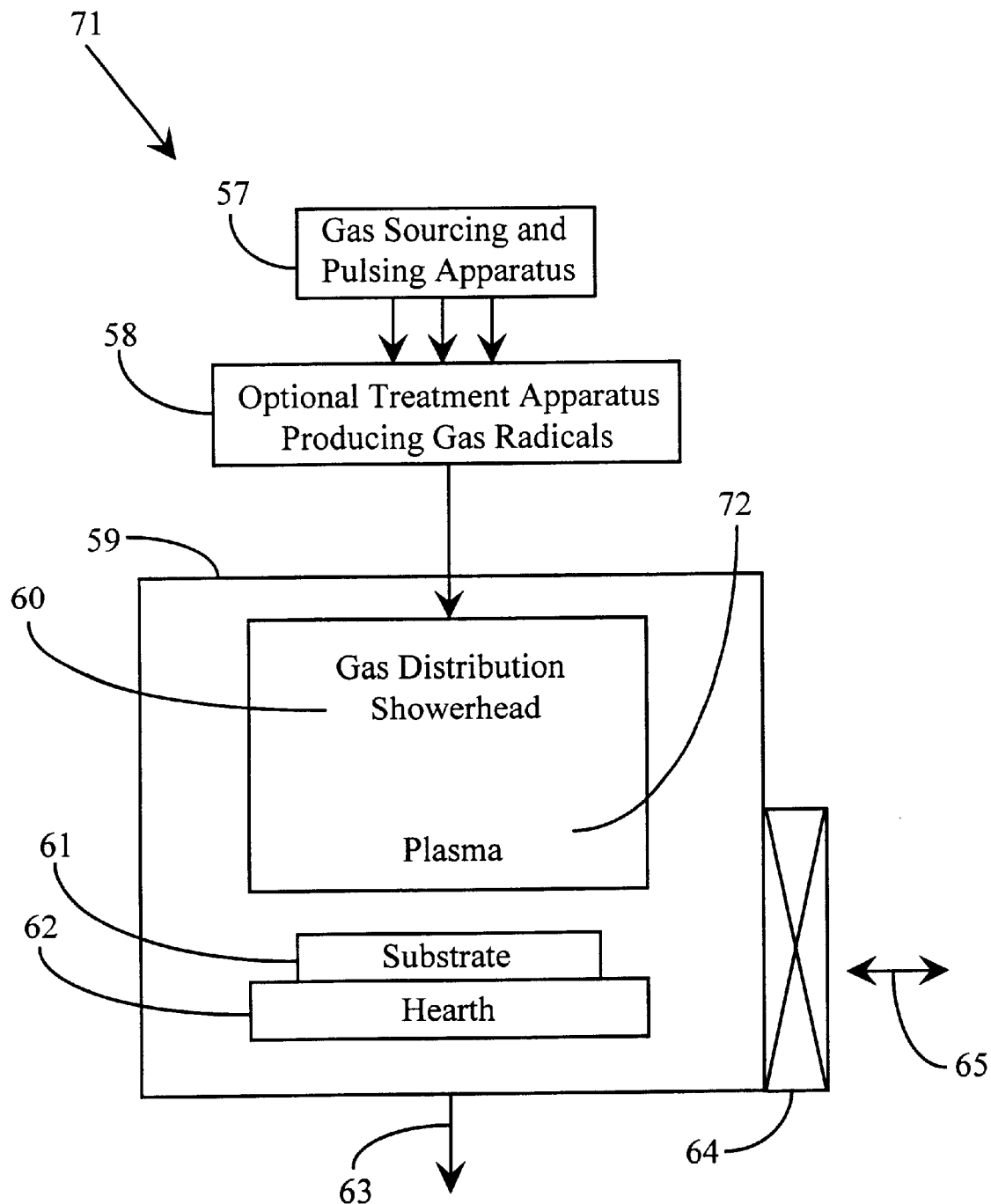
FIG. 9 illustrates a fourth implementation of the reactor in FIG. 6.

FIG. 9 is a generalized diagram for a system 71 for practicing RAS-CVD in yet a further embodiment of the present invention. In FIG. 9, two embodiments of the Pre-Reactor 72 are shown. The first is the incorporation of the Pre-Reactor 72 into the Gas Distribution Showerhead 60 which is conceptually similar to FIG. 7. In this new embodiment, however, the undesired CVD side reactions are caused to occur within the combination Gas Distribution Showerhead 68 and Pre-Reactor 72 by activating the undesired CVD side reaction using an RF plasma generated within the showerhead. This process causes rapid depletion of the undesired chemical "tail" and eliminates the possibility that the side reaction will occur on the substrate allowing a decrease in the time between each chemical reactant entering the system.

In addition to these variations it will be apparent to the skilled artisan that one may, by incorporating processes described herein, alternate process steps in a manner that alloys of two, three or more metals may be deposited, compounds may be deposited with two, three or more constituents, and such things as graded films and nano-laminates may be produced as well. These variations are simply variants using particular embodiments of the invention in alternating cycles, typically in-situ. There are many other variations within the spirit and scope of the invention, so the invention is limited only by the claims that follow. Further, in particular reference to the pre-reaction chamber aspects of the invention, it will be apparent to the skilled artisan that various deviations from the embodiments described will still fall within the spirit and scope of the present invention, and, in addition, many combinations of embodiments and variations may be made. For example, a plasma activation may readily be used in a pre-reaction chamber within the scope of the invention, wherein the chamber itself may assume any of a wide variety of forms.

What is claimed is:

1. A coating system, comprising:

a coating chamber having a support for a substrate to be coated;

a gas distribution apparatus within the coating chamber;

a gas sourcing and pulsing apparatus producing alternating pulses of at least first and second gases;

a treatment apparatus connected to and accepting gases from the gas sourcing and pulsing apparatus, said treatment apparatus forming into radicals at least of a portion of the gases received; and a pre-reactor apparatus connected to both the treatment apparatus and the gas distribution apparatus, and having an energy provision system;

characterized in that, after a pulse of a first gas, and prior to a pulse of a second gas, the pre-reactor apparatus, through the energy provision system, causes trace amounts of the first gas to coat on surfaces of the pre-reactor apparatus, preventing said trace amounts from existing in the coating chamber as the second gas is pulsed.

2. The coating system of claim 1 wherein, by repeated pulses of the at least first and second gases into the coating chamber, an Atomic Layer Deposition process is accomplished.

3. The coating system of claim 1 wherein the pre-reactor apparatus comprises a separate chamber between the gas sourcing and pulsing apparatus and the coating chamber.

4. The coating system of claim 3 wherein the energy provision system comprises heating a surface within the confines of the separate chamber.

5. The coating system of claim 3 wherein the energy provision system comprises striking a plasma in the separate chamber.

6. The coating system of claim 1 wherein the pre-reactor apparatus comprises gas supply tubing between the gas sourcing and pulsing apparatus and the coating chamber.

7. The coating system of claim 6 wherein the energy provision system comprises heating walls of the gas supply tubing.

8. The coating system of claim 1 wherein the pre-reactor apparatus is incorporated in the gas distribution apparatus, comprising an energy-activated showerhead within the coating chamber.

9. The coating system of claim 8 wherein the substrate support is heated, and the energy provision system comprises heat transfer to a wall of the showerhead facing the substrate support.

10. The coating system of claim 8 wherein the energy provision system comprises striking a plasma within the showerhead.

* * * * *